United States Patent [19]
Sakurai

[11] Patent Number: 5,371,400
[45] Date of Patent: Dec. 6, 1994

[54] SEMICONDUCTOR DIODE STRUCTURE

[75] Inventor: Keiji Sakurai, Nagano, Japan

[73] Assignee: Fuji Electric Co., Ltd., Kawasaki, Japan

[21] Appl. No.: 149,070

[22] Filed: Nov. 9, 1993

[30] Foreign Application Priority Data

Nov. 9, 1992 [JP] Japan .................. 4-297497

[51] Int. Cl.$^5$ .............................. H01L 29/48
[52] U.S. Cl. .................... 257/478; 257/479; 257/482; 257/485; 257/741; 257/766; 257/770
[58] Field of Search ............... 257/478, 479, 482, 485, 257/741, 766, 770

[56] References Cited

U.S. PATENT DOCUMENTS 4,646,115 2/1987 Shannon et al. ............ 257/478

FOREIGN PATENT DOCUMENTS 59-35183 8/1984 Japan .
3-105975 3/1991 Japan .
3-65027 10/1991 Japan .

*Primary Examiner*—Edward Wojciechowicz
*Attorney, Agent, or Firm*—Brumbaugh, Graves, Donohue & Raymond

[57] ABSTRACT

Desirably, a Schottky barrier semiconductor diode has low forward direction rising voltage and high inverse direction yield voltage. A semiconductor device is provided with a first metal producing a low Schottky barrier and a second metal producing a high Schottky barrier. The forward direction rising voltage is reduced on account of the first metal. The inverse direction yield voltage, which is decreased due to the lowered forward rising voltage, is compensated for upon linking of depletion regions generated by forming the PN junction under the first metal layer and not under the second metal layer. As a result, a high inverse yield voltage is realized.

17 Claims, 2 Drawing Sheets

SEMICONDUCTOR DIODE STRUCTURE

BACKGROUND OF THE INVENTION

The invention relates to semiconductor devices and, in particular, to semiconductor devices comprising a diode structure utilizing a Schottky barrier.

A semiconductor diode with a Schottky barrier between a metal and a semiconductor has a lower forward rising voltage than that of a device utilizing a PN junction. Also, its inverse direction restoring time is shorter, as it is free of an accumulation phenomenon caused by minority carriers. However, its inverse direction yield voltage is lower.

In an attempt to reduce the forward direction rising voltage in such a Schottky barrier semiconductor device, the metal of the Schottky barrier (hereinafter referred to as the barrier metal) has been varied, and the on-resistance has been reduced by decreasing the thickness of the epitaxial semiconductor layer contacted by the barrier metal. However, such techniques decrease the inverse direction yield voltage even more.

In other devices, disclosed, e.g., in Japanese Patent Document 59-35183 or in Japanese Patent Document 3-105975, regions of a p-type semiconductor in contact with the barrier metal are disposed at the surface of an n-type semiconductor contacted by the barrier metal, and depletion regions, extending into the n-type semiconductor layer from the adjoining p-type semiconductor regions when an inverse direction voltage is applied, are linked to each other to suppress leaking current flowing through the Schottky barrier. This results in a PN junction in parallel with the Schottky barrier, an in impaired switching characteristics due to injection of minority carriers from the PN junction.

SUMMARY OF THE INVENTION

The present invention provides a semiconductor diode structure with further reduced forward direction rising voltage, without reduction of the inverse direction yield voltage. High-speed switching characteristics are maintained.

These advantages are realized in a semiconductor device comprising a first semiconductor region of a first conductivity type; second semiconductor regions of a second conductivity type, separated by first and second distances, the first distance being less than the second distance; a first electrode of a first metal contacting a first portion of the first semiconductor region along the first distance, and contacting at least part of the surface of the second semiconductor regions delimiting the first distance; a second electrode of a second metal contacting a second portion of the first semiconductor region along the second distance, and contacting at least part of the surface of the second semiconductor regions delimiting the second distance; the second electrode being electrically connected to the first electrode; and Schottky barrier height between the first semiconductor region and the first electrode being less than Schottky barrier height between the first semiconductor region and the second electrode.

Such a semiconductor device has forward characteristics corresponding to those of the Schottky barrier between the first electrode and the semiconductor layer of the first conductivity type, with reduced rising voltage. Also, as the depletion regions extending from the regions of the second conductivity type to the semiconductor layer of the first conductivity type are linked with a voltage lower than that of the semiconductor layer of the first conductivity type below the second electrode, its inverse direction characteristics cause the inverse direction characteristics of the Schottky barrier between the second electrode and the semiconductor layer of the first conduction type to be dominant. Thus, with the forward direction rising voltage being reduced by the first metal's lower Schottky barrier, a higher inverse direction yield voltage is obtained by the second metal's higher Schottky barrier.

Impairment of switching characteristics due to the PN junction in parallel with the Schottky barrier can be minimized by reducing the area of the PN junction below 50%, or/and by applying a treatment to shorten carrier life.

BRIEF DESCRIPTION OF THE DRAWING

A more complete appreciation of the invention and of attendant advantages will be obtained readily from the detailed description and with reference to the drawing.

FIG. 1b is a top view. FIG. 1a is a cross section along the line A—A in FIG. 1b.

DESCRIPTION OF PREFERRED EMBODIMENTS

Figure 1A:
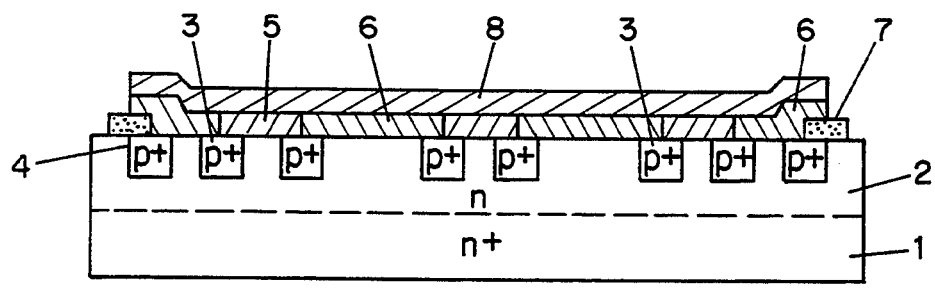
FIG. 1a and 1b show a semiconductor device according to an exemplary embodiment of the invention.

Preferred embodiments of the present invention are explained below with reference to the drawing.

Figure 1B:
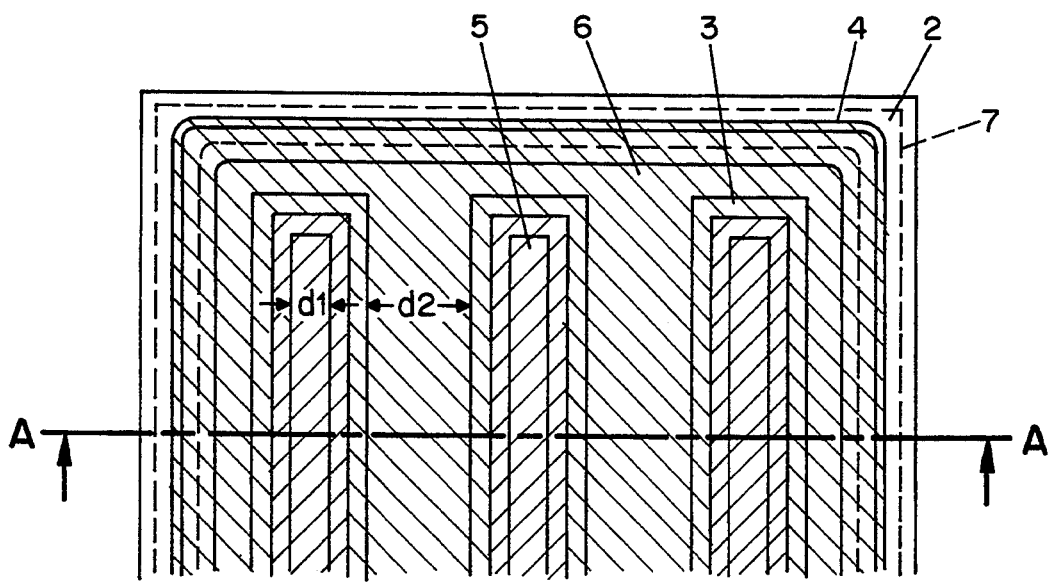

FIGS. 1a and 1b show a silicon substrate 1 with an n-layer 2, which is a semiconductor layer of the first conductivity type, grown epitaxially on the n+-substrate 1. Regions 3 of a second conductivity type, having a width of 10 $\mu$m, are formed as p+-regions at the surface of the n-layer 2 through impurity diffusion. The regions 3 have a long and narrow rectangular ring form with an inner width d1 of 10 $\mu$m. The distance d2 between adjacent p+-regions 3 is 50 $\mu$m. A p+-guard ring 4 having a large square ring form surrounds the p+-regions 3 at the circumference of the substrate. A titanium layer 5, which is the first barrier metal, contacts about half the area of each p+-region 3, and also the area of the n-layer 2 surrounded by the p+-regions 3. A molybdenum layer 6, which is the second barrier metal, contacts the remaining half of each p+-region 3, and contacts also the area of the n-layer 2 surrounding the p+-regions 3 and an oxide film 7 which covers half of the surface of the guard ring 4. The titanium layer 5 and the molybdenum layer 6 are electrically connected by a third metal layer 8 that covers both layers. The titanium Schottky barrier is 0.5 eV, which is lower than the molybdenum Schottky barrier of 0.66 eV.

Advantageously, a treatment is applied to shorten carrier life in the vicinity of the PN junction between the p+-regions 3 and the n-layer 2, comprising, e.g., diffusion of a heavy metal or electron-beam irradiation.

Under a reverse voltage, depletion regions are formed in portions of the n-layer 2 adjacent to p+- regions 3. Preferably, the depletion regions are linked along the distance d1 between p+-regions 3, but not along the distance d2.

Preferably also, the ratio of the area of the p+-regions 3 to the sum of the contact areas of the first and second electrodes 5 and 6 to the n-regions 2 and to the p+-regions 3 is in a range from 5% to 50%. If this ratio is smaller, the inverse direction yield voltage is not appreciably raised by the PN junction. If the ratio is larger, the cumulative effect of the minority carriers at the PN junction tends to degrade the switching characteristics of the Schottky barrier diode. Degradation of switching characteristics due to the PN junction can be minimized also by a treatment for shortening carrier life, e.g., by diffusion of a so-called life-time killer such as gold or platinum, or by electron beam irradiation.

Figure 2:
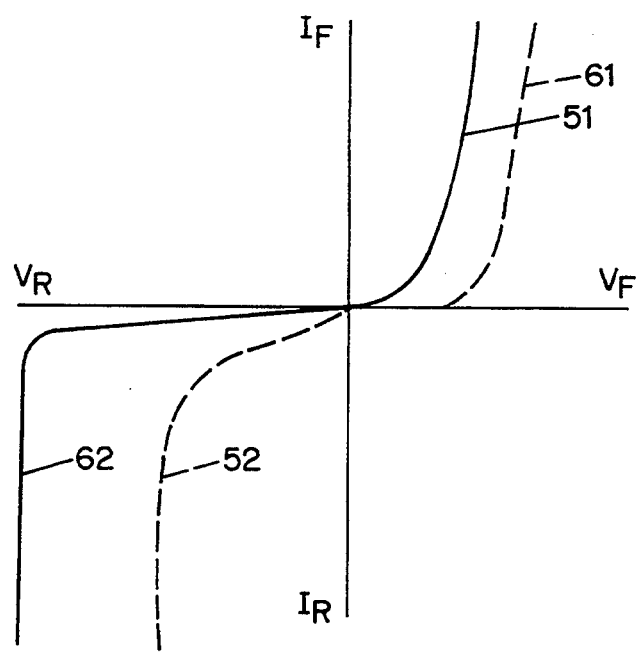
FIG. 2 is diagram of the current-voltage characteristics of the device of FIG. 1, and of an ordinary Schottky barrier used for comparison.

In FIG. 2, the forward direction current-voltage characteristics of a titanium Schottky barrier semiconductor diode are represented by line 51, and its inverse direction characteristics by line 52. The forward direction current-voltage characteristics of a molybdenum Schottky barrier semiconductor diode are represented by line 61, and its inverse direction characteristics by line 62. The characteristics of the device of FIG. 1 are represented by line 51 corresponding to the lower Schottky barrier in the forward direction, and by line 62 corresponding to the higher Schottky barrier in the inverse direction. By suitable combination of first and second metals, the forward and inverse characteristics can be adjusted. For example, chromium with a Schottky barrier of 0.6 eV may be used for the metal layers 5 or 6. By selecting a combination, e.g., titanium and chromium, or chromium and molybdenum (or titanium and molybdenum), the device characteristics can be adjusted specifically.

Figure 3:
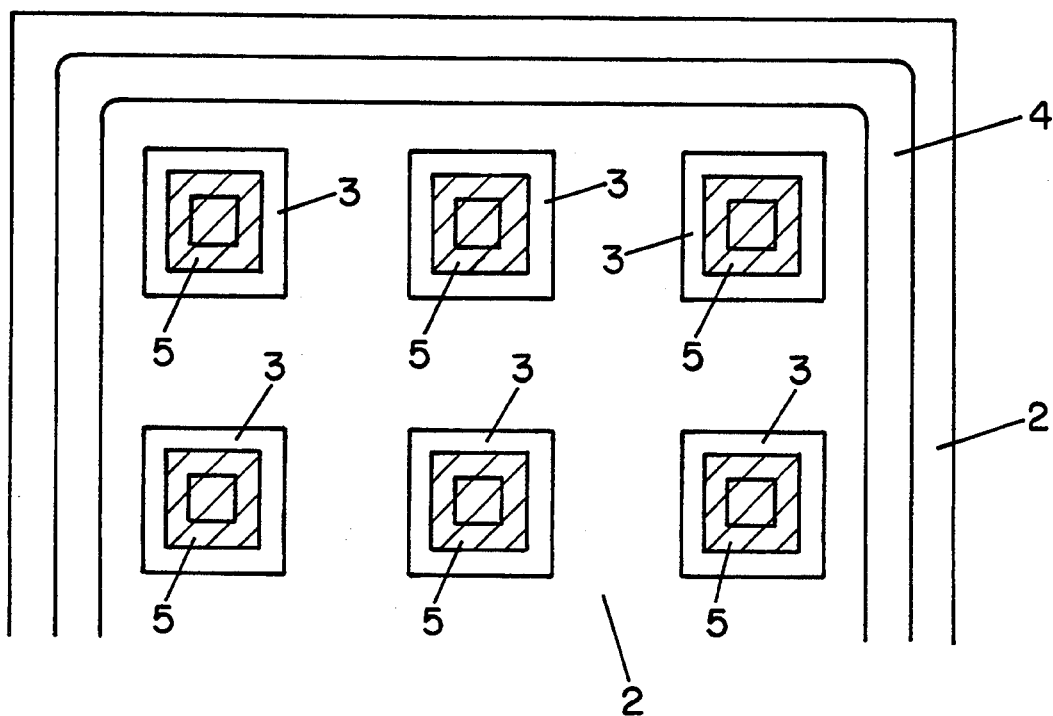
FIG. 3 shows a semiconductor device, in top view, according to another exemplary embodiment of the invention.
Figure 4:
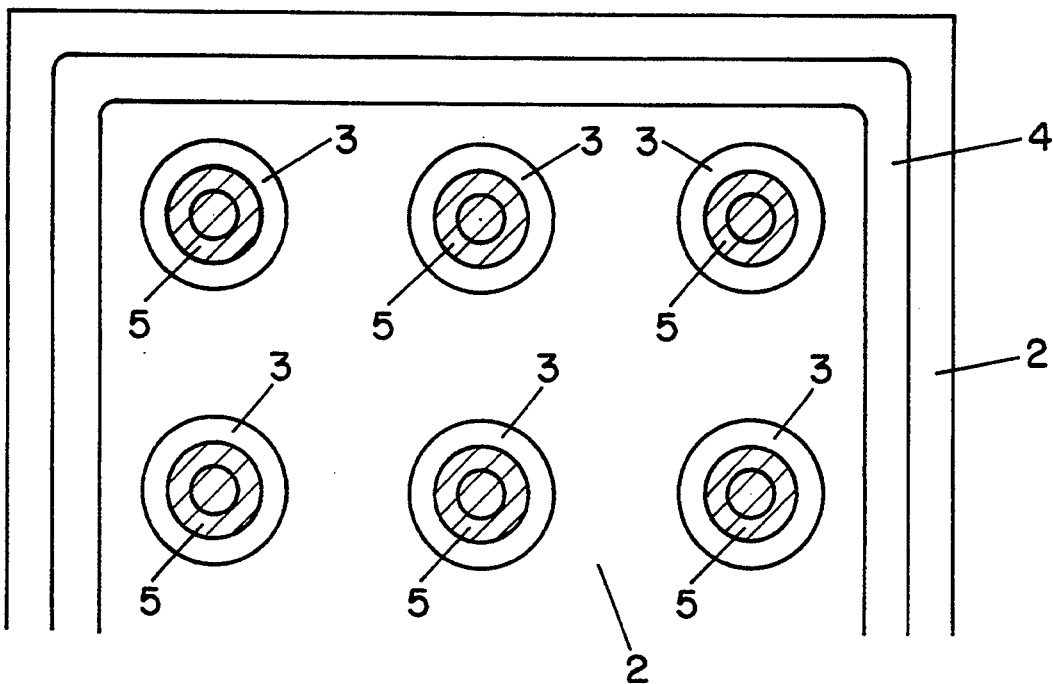
FIG. 4 shows a semiconductor device, in top view, according to a further exemplary embodiment of the invention.

FIGS. 3 and 4 show further embodiments of the present invention. In the embodiment of FIG. 3, the p+-regions 3 have a square ring form, and the titanium layers 5 form squares. In the embodiment of FIG. 4, the p+-regions 3 have a round ring form, and the titanium layers 5 form circles.

The invention can be practiced otherwise than as exemplified hereinabove, as variations and modifications will be apparent to the person skilled in the art.

I claim:

1. A semiconductor device comprising:
   a first semiconductor region of a first conductivity type;
   second semiconductor regions of a second conductivity type, separated by first and second distances, the first distance being less than the second distance;
   a first electrode of a first metal contacting a first portion of the first semiconductor region along the first distance, and contacting at least part of the surface of the second semiconductor regions delimiting the first distance;
   a second electrode of a second metal contacting a second portion of the first semiconductor region along the second distance, and contacting at least part of the surface of the second semiconductor regions delimiting the second distance;
   the second electrode being electrically connected to the first electrode; and Schottky barrier height between the first semiconductor region and the first electrode is less than Schottky barrier height between the first semiconductor region and the second electrode.

2. The semiconductor device of claim 1, wherein the first and the second distances are such that, for a reverse voltage, depletion regions in the first semiconductor region near the second semiconductor regions are linked along the first distance, and are not linked along the second distance.

3. The semiconductor device of claim 1, wherein PN junctions between the first and the second semiconductor regions have an area in a range from 5% to 50% of total contacted area.

4. The semiconductor device of claim 1, wherein a junction between the first and second semiconductor regions is treated for shortened carrier life in a vicinity of the junction.

5. The semiconductor device of claim 4, wherein treatment for shortened carrier life comprises heavy-metal diffusion.

6. The semiconductor device of claim 4, wherein treatment for shortened carrier life comprises electron-beam irradiation.

7. A semiconductor device comprising:
   a first region of a first conductivity type;
   a second region of a second conductivity type, here called annulet region, having closed shape with center excluded, adjoining the first region;
   a third region of the first conductivity type surrounding the annulet region and adjoining the first region;
   a fourth region of the first conductivity type in the center of the annulet region and adjoining the first region;
   a fifth region comprising:
      (a) a first electrode of a first metal contacting the surface of the fourth region and part of the surface of the annulet region, and
      (b) a second electrode of a second metal contacting the surface of the third region and part of the surface of the annulet region.

8. The semiconductor device of claim 7, wherein the first electrode consists of a different material than the second electrode.

9. The semiconductor device of claim 7, wherein both electrodes are electrically connected.

10. The semiconductor device of claim 7, wherein Schottky barrier height between the first region and the first electrode is less than Schottky barrier height between the third region and the second electrode.

11. The semiconductor device of claim 7, wherein junctions between the first and the second semiconductor regions have a combined area in a range from 5% to 50% of total contacted area.

12. The semiconductor device of claim 7, wherein a junction between the first region and the second region is treated for shortened carrier life in a vicinity of the junction.

13. A semiconductor device comprising:
   a first region of a first conductivity type;
   one or more regions of a second conductivity type, here called annulet regions, having closed shape with center excluded, adjoining the first region;
   one region of the first conductivity type surrounding the annulet regions and adjoining the first region;
   one or more regions of the first conductivity type in the centers of the annulet regions;
   a first electrode of a first metal contacting the surface of the first conductivity type regions in the centers of the annulet regions and part of the surface of the annulet regions; and a second electrode of a second metal contacting the surface of the first conductivity type region surrounding the annulet regions and part of the surface of the annulet regions.

14. The semiconductor device of claim 13, wherein both electrodes are electrically connected, and wherein Schottky barrier height between the region of the first conductivity type and the first electrode is less than Schottky barrier height between the region of the first conductivity type and the second electrode.

15. The semiconductor device of claim 13, wherein the distance between the annulet regions is greater than the diameter or width of the annulet regions.

16. The semiconductor device of claim 13, wherein junctions between the first and the second semiconductor regions have a combined area in a range from 5% to 50% of total contacted area.

17. The semiconductor device of claim 13, wherein junctions between the annulet regions and the first conductivity type regions are treated for shortened carrier life in a vicinity of the junctions.

* * * * *